(12) United States Patent
Ono et al.

(10) Patent No.: US 11,809,695 B2
(45) Date of Patent: Nov. 7, 2023

(54) IMAGE DISPLAY DEVICE AND IMAGE DISPLAY METHOD

(71) Applicant: FUJI CORPORATION, Chiryu (JP)

(72) Inventors: Keiichi Ono, Anjo (JP); Kenji Sugiyama, Anjo (JP); Masafumi Amano, Okazaki (JP); Go Uchida, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 10 days.

(21) Appl. No.: 17/628,488

(22) PCT Filed: Jul. 22, 2019

(86) PCT No.: PCT/JP2019/028624
§ 371 (c)(1),
(2) Date: Jan. 19, 2022

(87) PCT Pub. No.: WO2021/014524
PCT Pub. Date: Jan. 28, 2021

(65) Prior Publication Data
US 2022/0253204 A1 Aug. 11, 2022

(51) Int. Cl.
*G06F 3/048* (2013.01)
*G06F 3/04845* (2022.01)
*G06F 3/0482* (2013.01)

(52) U.S. Cl.
CPC ........ *G06F 3/04845* (2013.01); *G06F 3/0482* (2013.01)

(58) Field of Classification Search
CPC .............................. G06F 3/04845; G06F 3/0482
See application file for complete search history.

(56) References Cited

U.S. PATENT DOCUMENTS

| 8,447,566 B2 * | 5/2013 | Maenishi | H05K 13/085 |
| | | | 702/182 |
| 2011/0302522 A1 * | 12/2011 | Cao | G06Q 10/06 |
| | | | 707/E17.014 |

(Continued)

FOREIGN PATENT DOCUMENTS

| JP | 2006-202934 A | 8/2006 |
| JP | 6075910 B2 * | 2/2017 |

(Continued)

OTHER PUBLICATIONS

International Search Report dated Oct. 1, 2019 in PCT/JP2019/028624 dated Jul. 22, 2019, 2 pages.

*Primary Examiner* — David Phantana-angkool
(74) *Attorney, Agent, or Firm* — Oblon, McClelland, Maier & Neustadt, L.L.P.

(57) ABSTRACT

An image display device configured to display, on a display screen, a predetermined image captured in a state in which multiple components to be mounted on a board are held by a mounting head, including: a display control section configured to selectably display, on the display screen, relevant information relating to the multiple components in association with each component, together with the predetermined image, and when a predetermined operation involving selection of any of the relevant information is performed by an operator, display an enlarged image of one component corresponding to the selected relevant information of the predetermined image being displayed.

18 Claims, 9 Drawing Sheets

(56) References Cited

U.S. PATENT DOCUMENTS

| | | | |
|---|---|---|---|
| 2013/0205259 A1* | 8/2013 | Borchardt | G06F 3/04815 715/834 |
| 2016/0054889 A1* | 2/2016 | Hadley | G06T 19/003 715/849 |
| 2018/0070487 A1* | 3/2018 | Takama | G06T 7/001 |
| 2018/0206369 A1* | 7/2018 | Takama | H05K 13/0815 |
| 2018/0206370 A1* | 7/2018 | Takama | H05K 13/081 |
| 2018/0263150 A1* | 9/2018 | Takama | H05K 13/082 |
| 2018/0310446 A1* | 10/2018 | Takama | H05K 13/0815 |
| 2018/0376635 A1* | 12/2018 | Iisaka | H05K 13/0417 |
| 2019/0339688 A1* | 11/2019 | Cella | H04L 1/18 |
| 2019/0364705 A1 | 11/2019 | Kubota | |
| 2020/0093042 A1 | 3/2020 | Oike et al. | |
| 2020/0348662 A1* | 11/2020 | Cella | G05B 23/0286 |
| 2021/0157312 A1* | 5/2021 | Cella | G05B 19/4184 |
| 2021/0223047 A1* | 7/2021 | Stewart | G06F 3/04812 |

FOREIGN PATENT DOCUMENTS

| | | |
|---|---|---|
| JP | 2018-132937 A | 8/2018 |
| WO | WO 2018/122903 A1 | 7/2018 |
| WO | WO 2018/131066 A1 | 7/2018 |

\* cited by examiner

| IMAGE ID | NOZZLE NUMBER | COMPONENT TYPE | DISPOSITION POSITION | IMAGE PROCESSING RESULT | | |
|---|---|---|---|---|---|---|
| | | | | POSITION | ANGLE | ERROR CODE |
| * | 1 | P | , | , | ** | — |
| | 2 | P | , | , |  | E*** |
| | 3 | P | , | , |  | E*** |
| | 4 | P | , | , |  | E*** |
| | 5 | P | , | , |  | — |
| | 6 | P | , | , |  | — |
| ⋮ | ⋮ | ⋮ | ⋮ | ⋮ | ⋮ | ⋮ |
| ⋮ | ⋮ | | | | | |

IMAGE DISPLAY DEVICE AND IMAGE DISPLAY METHOD

TECHNICAL FIELD

The present specification discloses an image display device and an image display method.

BACKGROUND ART

Conventionally, a device capable of displaying an image captured in a state in which a component is held by a mounting head has been proposed (for example, refer to Patent Literature 1). For example, Patent Literature 1 describes a device in which a mounting head includes multiple nozzles, an image is captured when the mounting head passes above an imaging unit in a state in which a component is held in each nozzle, and the image is transmitted to a management computer. Accordingly, the management computer can display an image on a display screen such as a display.

PATENT LITERATURE

Patent Literature 1: WO 2018/122903

BRIEF SUMMARY OF THE INVENTION

Technical Problem

In a case in which the image described above is displayed on the display screen, multiple components appear in the image. From the image, for example, an operator may select a component in order to confirm the component or to perform edit of the data of the component. However, in recent years, since as the component has downsized, the component in the image has also become smaller, it is difficult to identify a component of a selection target from among multiple components, so that there is a case in which an operator erroneously selects the component. In this case, an operation such as confirmation or edit is performed without noticing that the component is an incorrect component, which may cause a problem.

A main object of the present disclosure is to cause an operator to appropriately select a desired component from multiple components included in an image, so that an operation relating to the selected component can be performed.

Solution to Problem

The present disclosure has taken following means to achieve the main object described above.

A first image display device of the present disclosure is an image display device configured to display, on a display screen, a predetermined image captured in a state in which multiple components to be mounted on a board are held by a mounting head, including: a display control section configured to selectably display, on the display screen, relevant information relating to the multiple components in association with each component, together with the predetermined image, and when a predetermined operation involving selection of any of the relevant information is performed by an operator, display an enlarged image of one component corresponding to the selected relevant information of the predetermined image being displayed.

The first image display device according to the present disclosure selectably displays relevant information relating to multiple components in association with each component, together with a predetermined image captured in a state in which multiple components to be mounted on a board are held by a mounting head. Then, when the predetermined operation involving the selection of any of the relevant information is performed by the operator, an enlarged image of one component corresponding to the selected relevant information of the predetermined image being displayed is displayed. As a result, the operator can cause the enlarged image of a desired component to be displayed by performing the predetermined operation involving the selection of the relevant information from the multiple components in the predetermined image while paying attention to the relevant information. Therefore, it is possible to easily perform the component confirmation operation using the enlarged image without making a selection error of the component to be enlarged.

DESCRIPTION OF EMBODIMENTS

Figure 1:
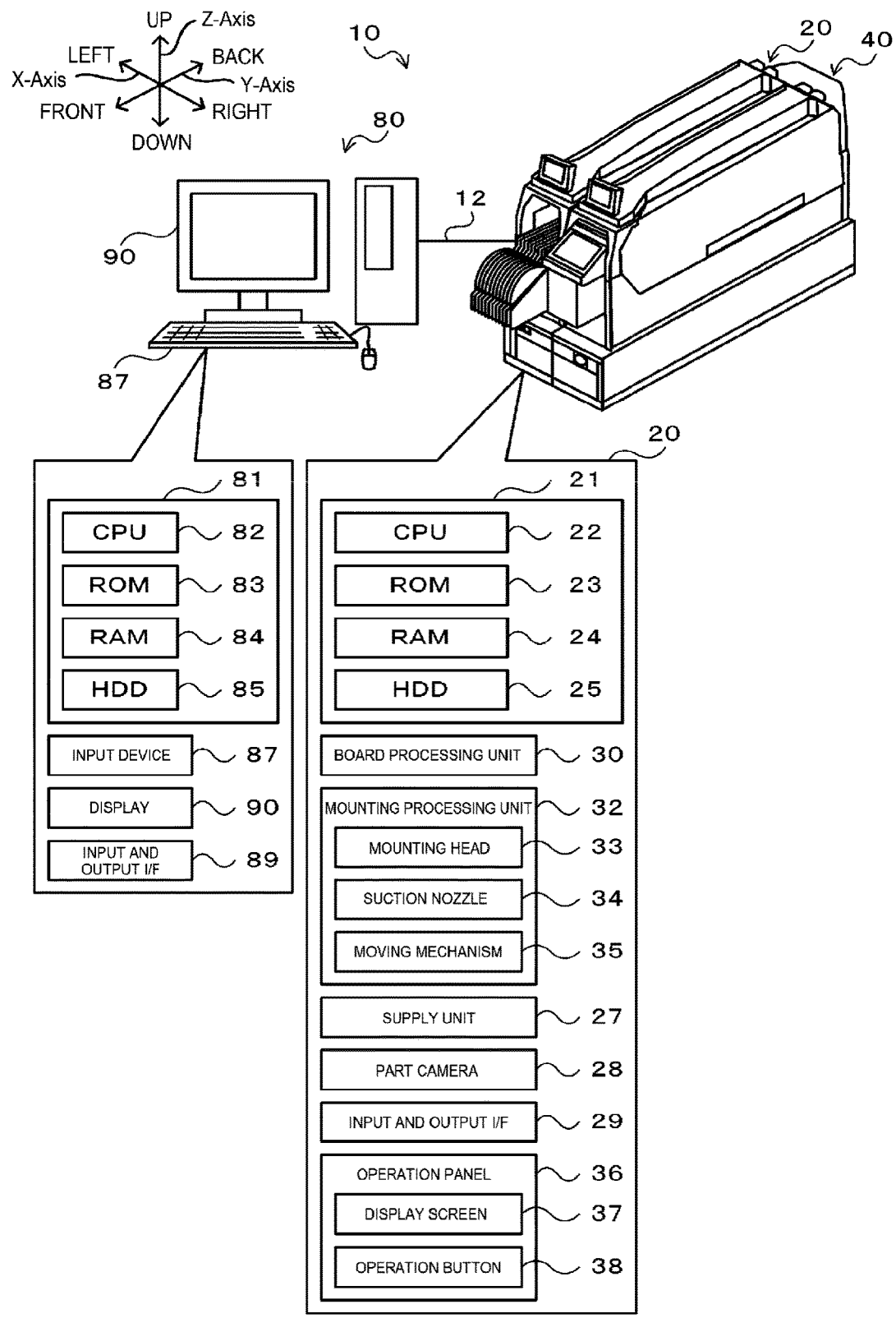
FIG. 1 is an explanatory view illustrating an example of component mounting system 10.
Figure 2:
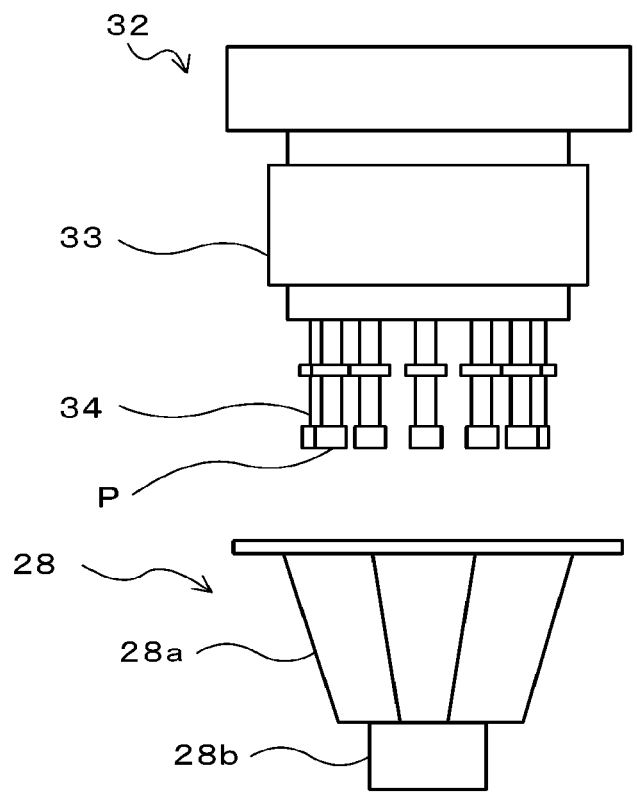
FIG. 2 is an explanatory view schematically illustrating configurations of mounting head 33 and part camera 28 of mounting device 20.

Next, embodiments of the present disclosure will be described with reference to the accompanying drawings. FIG. 1 is an explanatory view illustrating an example of component mounting system 10 and FIG. 2 is an explanatory view schematically illustrating configurations of mounting head 33 and part camera 28 of mounting device 20.

As illustrated in FIG. 1, component mounting system 10 includes mounting device 20 that picks up component P (refer to FIG. 2) from a reel, a tray, or the like and mounts component P on a board, inspection device 40 that inspects a board on which multiple components P are mounted, and management device 80 that manages information relating to mounting device 20 and inspection device 40. Mounting device 20, inspection device 40, and management device 80 are connected to LAN 12 serving as a network, and can exchange information with each other. Although one mounting device 20 and one inspection device 40 are illustrated in FIG. 1, multiple mounting devices 20 and inspection devices 40 may be provided. In the present embodiment, a left-right direction (X-axis), a front-rear direction (Y-axis), and an up-down direction (Z-axis) are illustrated as in FIG. 1. The term "mounting" includes disposing, attaching, inserting, bonding, adhering, or the like component P on the board.

Mounting device 20 includes mounting control unit 21 that executes various controls, board processing unit 30 that conveys and fixes the board in an X-direction, and mounting processing unit 32 that disposes component P on the board. In addition, mounting device 20 includes supply unit 27 that supplies component P accommodated in the reel, the tray, or the like to a predetermined supply position, part camera 28 that captures an image of component P, input and output interface (I/F) 29 for performing communication, and operation panel 36 capable of displaying various information and performing various input operations by an operator.

Mounting processing unit 32 includes mounting head 33, multiple suction nozzles 34 attached to mounting head 33 via a nozzle holding body, and moving mechanism 35 that moves mounting head 33 in XY-directions. Mounting head 33 is configured as a rotary head in which multiple suction nozzles 34 (for example, 12 suction nozzles) are arranged at equal intervals on the same circumference. Mounting head 33 incorporates a Z-axis motor (not illustrated) and adjusts a height of suction nozzle 34 by the Z-axis motor. Suction nozzle 34 uses a pressure to pick up component P to a nozzle tip or to separate component P picked up to the nozzle tip. Moving mechanism 35 includes an X-direction slider (not illustrated) movable in the X-direction and a Y-direction slider (not illustrated) movable in a Y-direction. As the X-direction slider moves or the Y-direction slider of moving mechanism 35 moves, mounting head 33 moves in the X-direction or the Y-direction. Each slider is driven by a drive motor.

Figure 3:
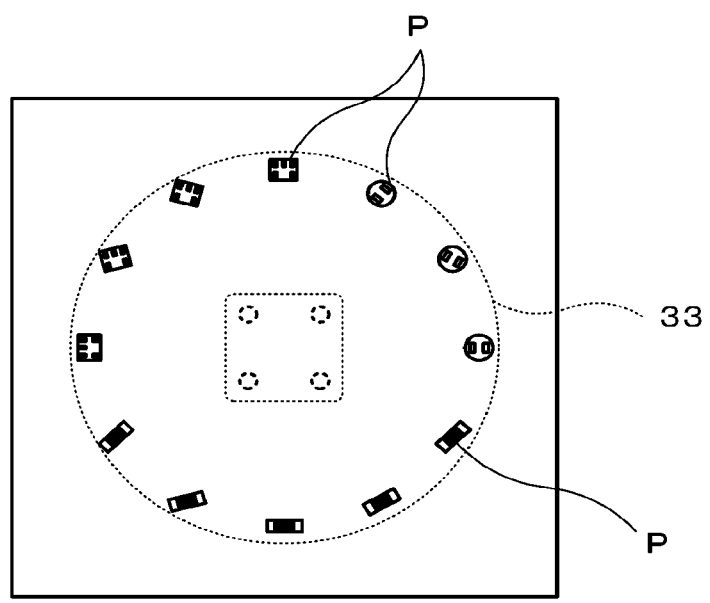
FIG. 3 is an explanatory view illustrating an example of an image captured by part camera 28.

As illustrated in FIG. 2, part camera 28 captures an image of a component held (picked up) by multiple suction nozzles 34 of mounting head 33 from below to generate an image. As illustrated in the drawing, part camera 28 includes lighting section 28a having multiple LEDs (not illustrated) attached to an inner surface of a housing having a truncated inverted octagonal pyramid with upper and lower surfaces opened, and camera main body 28b disposed below the housing. Although not illustrated, camera main body 28b includes an imaging element that outputs electric charge generated by light reception, an image processing section that generates image data based on the output electric charge, and the like. Part camera 28 outputs the generated image data to mounting control unit 21. FIG. 3 is an explanatory view illustrating an example of an image captured by part camera 28. As described above, since suction nozzles 34 are arranged on the same circumference at equal intervals, components P picked up by suction nozzles 34 are also arranged on the same circumference at equal intervals and appear in an image. In addition, since an image is captured such that multiple components P fall within one image, each component P appears small in the image. In recent years, since the downsizing of component P has progressed, it may be difficult for the operator to confirm details of component P in the image.

Operation panel 36 includes display screen 37 that displays various information and operation button 38 that receives an input operation of the operator. Display screen 37 is configured as a liquid crystal display and displays mounting information, setting information, images, and the like of mounting device 20. Operation button 38 includes a cursor button that moves a selection cursor in display screen 37 in the up-down direction and the left-right direction, a decision button that determines a selection content, a cancel button that cancels an input, and the like.

Mounting control unit 21 is configured as a microprocessor centered on CPU 22 and includes ROM 23 that stores a processing program, RAM 24 that is used as an operation area, HDD 25 that stores various data, and the like, which are connected via a bus. Mounting control unit 21 outputs a control signal to board processing unit 30, mounting processing unit 32, and supply unit 27 via input and output interface 29, outputs an imaging signal to part camera 28, outputs a display signal to operation panel 36, and outputs information to management device 80. Mounting control unit 21 inputs a signal from board processing unit 30, mounting processing unit 32, and supply unit 27 via input and output interface 29, acquires an image captured by part camera 28, inputs an operation signal from operation panel 36, or receives information from management device 80.

In addition, mounting control unit 21 acquires mounting information including conditions relating to the mounting of each component P from management device 80, and executes mounting processing. In the mounting processing, mounting control unit 21 causes each suction nozzle 34 of mounting head 33 to pick up component P, causes moving mechanism 35 to move mounting head 33 onto part camera 28, and causes part camera 28 to capture the image of component P picked up (held) by each suction nozzle 34. Mounting control unit 21 calculates a positional deviation amount or a rotational deviation amount of each component P by performing the image processing on the captured image, corrects a mounting position or a mounting direction based on the deviation amounts, and mounts each component P at the mounting position on the board. In the image processing, mounting control unit 21 recognizes a shape and a center position of each component P in the image, and calculates the positional deviation amount of component P with respect to the pickup position of each suction nozzle 34 or the rotational deviation amount of component P with respect to a predetermined reference direction. In addition, mounting control unit 21 determines whether there are shape errors such as dimensional defects, deformation, chipping, and adhesion of foreign matter in an outer shape based on whether the shape of component P in the image is within a predetermined permissible range with respect to the shape data stored in advance. In addition, mounting control unit 21 determines whether there is a positional deviation error or a rotational deviation error based on whether the positional deviation amount or the rotational deviation amount of component P is within a predetermined permissible range. Further, mounting control unit 21 determines whether there is a pickup error based on whether component P is recognized from the captured image. When performing the image processing, mounting control unit 21 transmits the entire image of multiple components P captured by part camera 28 and the relevant information relating to components P to management device 80. Management device 80 stores the received entire image and the relevant information in HDD 85.

Figures 4, 5:
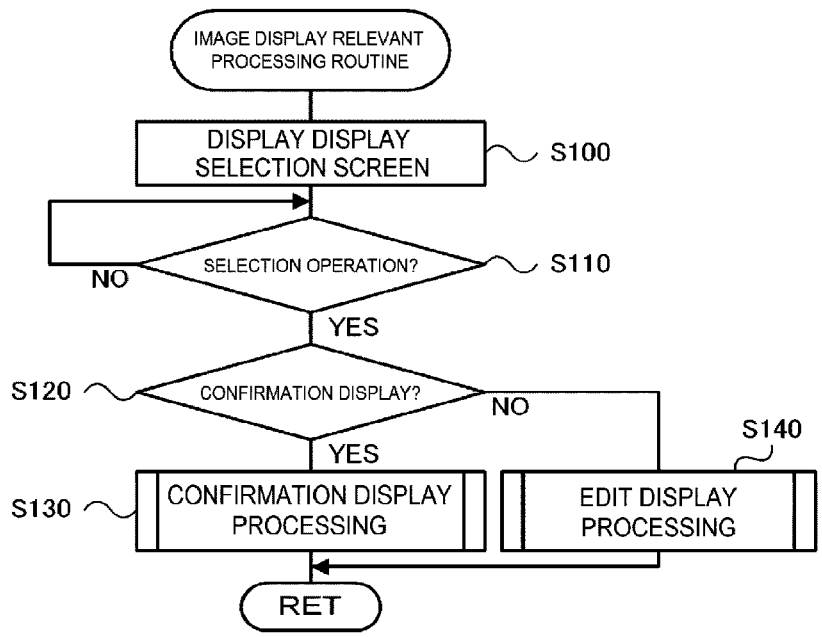
FIG. 4 is an explanatory view illustrating an example of relevant information 86.
FIG. 5 is a flowchart illustrating an example of an image display relevant processing routine.

FIG. 4 is an explanatory view illustrating an example of relevant information 86. Relevant information 86 includes an image ID of the entire image captured by part camera 28, the nozzle number of each suction nozzle 34, the component type of picked up component P, the disposition position of component P, and the image processing result. The image processing result includes the positional deviation amount or the rotational deviation amount of component P described above, an error code indicating the type of error in a case in which an error has occurred, and the like. The same relevant information as in FIG. 4 may be stored in HDD 25 of mounting control unit 21.

Management device 80 includes control device 81 and manages mounting device 20 and inspection device 40. Control device 81 is configured as a microprocessor centered on CPU 82 and includes ROM 83 for storing a processing program, RAM 84 used as a operation area, HDD 85 for storing various data, and the like, which are connected via a bus. Management device 80 includes input device 87 such as a keyboard and a mouse for the operator to input various instructions, display 90 for displaying various information, and input and output interface (I/F) 89 for performing communication. HDD 85 stores various information used for mounting in mounting device 20 and inspection in inspection device 40. In addition, HDD 85 stores various software such as display software for displaying various images such as the entire image of component P captured by part camera 28 of mounting device 20, and edit software for editing shape data used for the image processing of component P.

The following is a description of an operation of component mounting system 10 configured as described above. Here, an operation will be described when the operator deals with an error, such as confirming component P for which an error has occurred in management device 80 or editing the shape data of component P, when an image processing error has occurred in mounting device 20 and production is stopped. The operation is not limited to the image processing error of mounting device 20 and may be performed when an error occurs in the inspection processing of inspection device 40, or may be performed other than when an error occurs. FIG. 5 is a flowchart illustrating an example of an image display relevant processing routine. This routine is stored in HDD 85 of management device 80 and is executed by CPU 82 of control device 81 in a case in which an instruction to display a display selection screen on display 90 is issued by an operation input of input device 87 by the operator.

When this routine is executed, first, CPU 82 displays a display selection screen on display 90 (S100) and waits for the operator to make a selection (S110). Although not illustrated, on the display selection screen, it is possible to select a display on display 90 of the confirmation screen for confirming component P in which an error has occurred and a display on display 90 of the edit screen for editing the shape data of component P. As will be described later, the operator can also edit the shape data of component P after first confirming component P in which the error has occurred on the confirmation screen. CPU 82 determines whether the display of the confirmation screen is selected (S120) when the selection is made by the operator, executes the confirmation display processing (S130) when it is determined that the display of the confirmation screen is selected, and terminates the image display relevant processing routine. On the other hand, when determining that the display of the edit screen is selected instead of the confirmation screen, CPU 82 executes the edit display processing (S140) and terminates the image display relevant processing routine.

Figure 6:
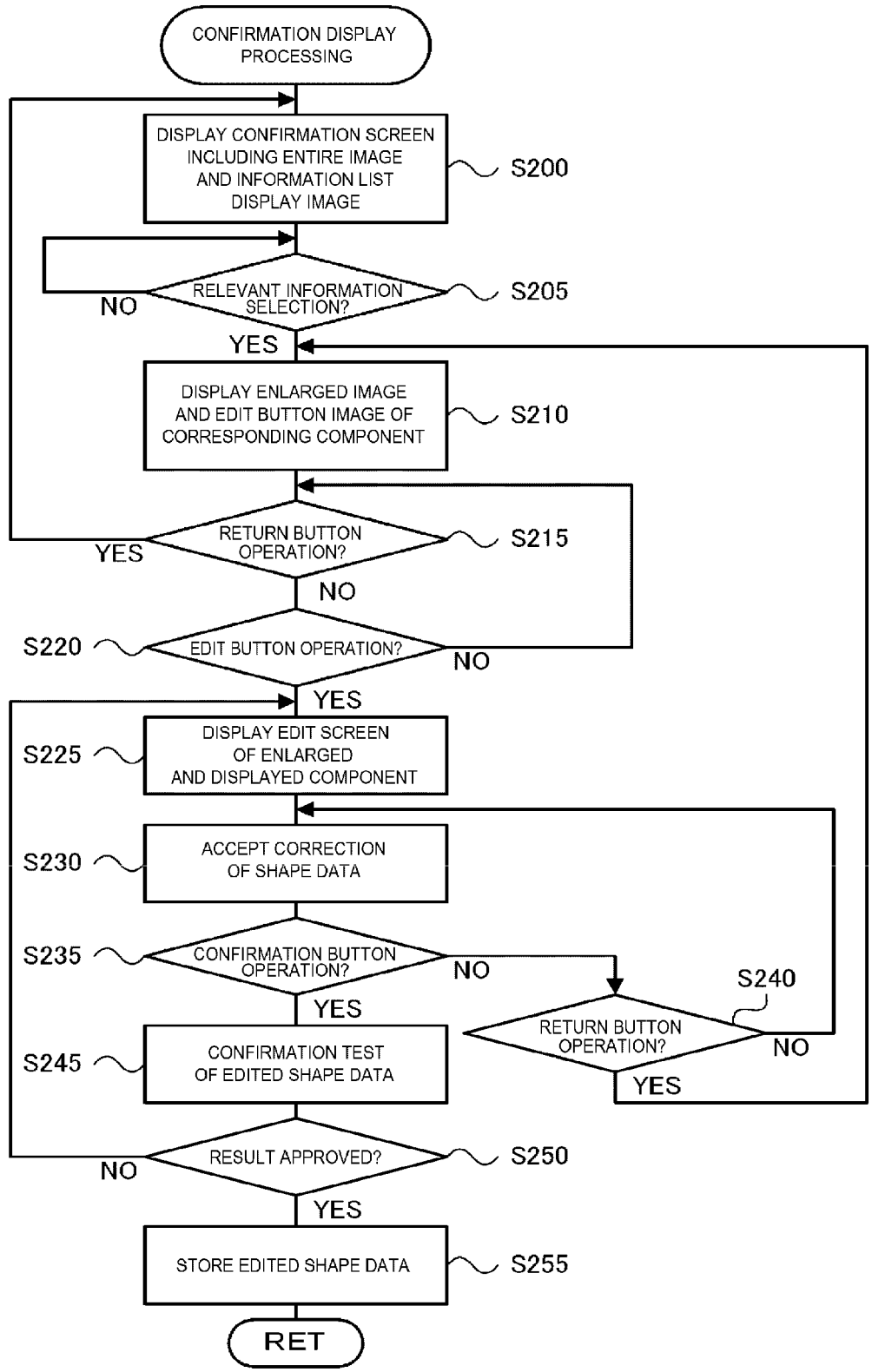
FIG. 6 is a flowchart illustrating an example of confirmation display processing.
Figure 7:
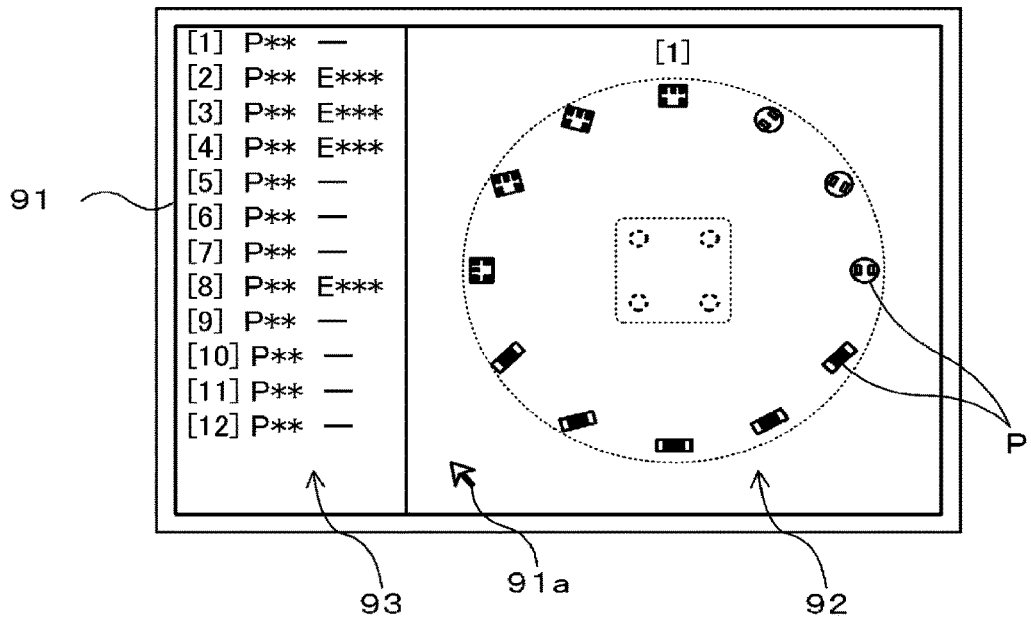
FIG. 7 is an explanatory view illustrating an example of confirmation screen 91 including entire image 92 of component P and information list display image 93.

FIG. 6 is a flowchart illustrating an example of the confirmation display processing. In the confirmation display processing, first, CPU 82 displays, on display 90, a confirmation screen including the entire image of multiple components P captured by part camera 28 and an information list display image in which at least a part of relevant information 86 is listed (S200). FIG. 7 is an explanatory view illustrating an example of confirmation screen 91 including entire image 92 of component P and information list display image 93. As illustrated in the drawing, information list display image 93 is displayed on confirmation screen 91 beside entire image 92 that is the same as the image (refer to FIG. 3) captured by part camera 28. In addition, cursor 91a that can be selected and inputted by input device 87 is displayed on confirmation screen 91. In information list display image 93, the component type of component P and the error code in a case in which an error has occurred are displayed in association with each other in the order of nozzle numbers [1] to [12] of respective suction nozzles 34. Accordingly, the relevant information is selectably listed in the order corresponding to the clockwise display position (nozzle position) of component P in entire image 92. In information list display image 93, each piece of relevant information can be selected by cursor 91a.

Figure 8:
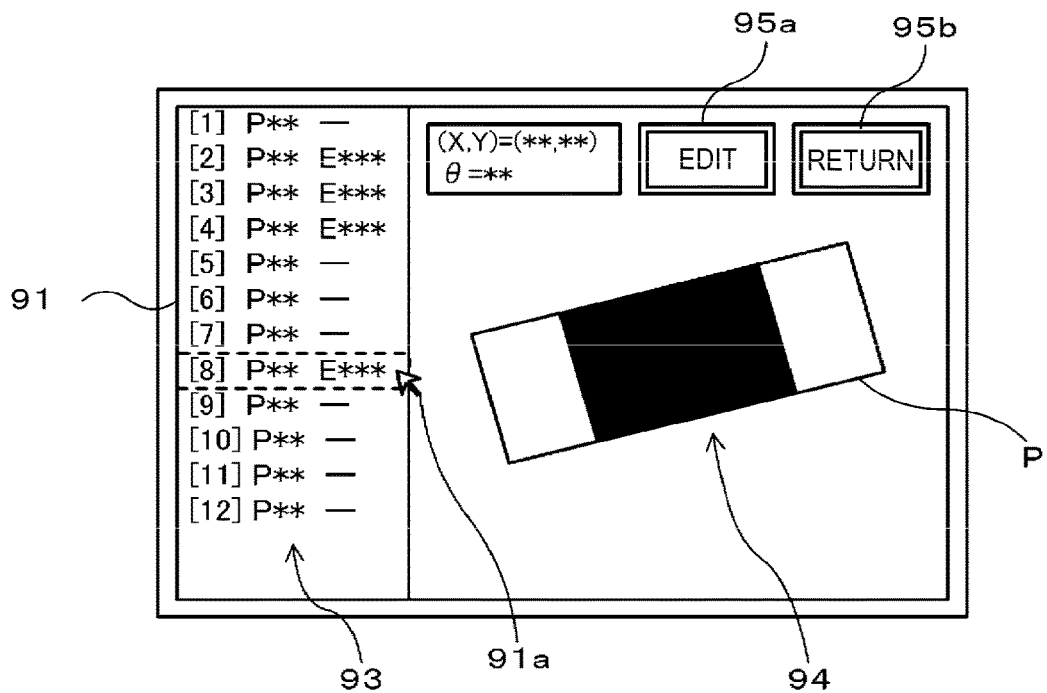
FIG. 8 is an explanatory view illustrating an example of confirmation screen 91 including enlarged image 94 of component P and information list display image 93.

When displaying confirmation screen 91 in FIG. 7, CPU 82 waits for any relevant information to be selected from information list display image 93 by the operation of cursor 91a (S205). When the relevant information is selected, CPU 82 displays an enlarged image and an edit button image of the component corresponding to the relevant information on confirmation screen 91 (S210). FIG. 8 is an explanatory view illustrating an example of confirmation screen 91 including enlarged image 94 of component P and information list display image 93. FIG. 8 illustrates a state in which enlarged image 94 of component P picked up by suction nozzle 34 of nozzle number [8] is displayed in place of entire image 92, in a case in which the relevant information of nozzle number [8] is selected by the operation of cursor 91a. In information list display image 93, since the error code is displayed in nozzle number [8] to indicate the occurrence of the image processing error, the operator can display enlarged image 94 to confirm the error content of component P. In addition to enlarged component P, enlarged image 94 displays image processing results such as positional deviation amount (X, Y) and rotational deviation amount θ of component P, edit button image 95a, and return button image 95b. Edit button image 95a is a button image for starting the edit of the shape data of enlarged component P and return button image 95b is a button image for returning from enlarged image 94 to entire image 92. These can be selected by operating cursor 91a. The display of the image processing result may be omitted.

When confirmation screen 91 in FIG. 8 including enlarged image 94 is displayed in this manner, CPU 82 waits for return button image 95b to be operated (S215) or edit button image 95a to be operated (S220). When return button image 95b is operated, CPU 82 returns to S200 to return the display from enlarged image 94 to entire image 92. On the other hand, when edit button image 95a is operated, CPU 82 displays edit screen 97 for editing the shape data of enlarged and displayed component P on display 90 (S225), and accepts the correction of the shape data by the operator (S230). Since the edit of the shape data is a function of the edit software described above, CPU 82 displays edit screen 97 together with activation of the edit software in S225.

Figure 9:
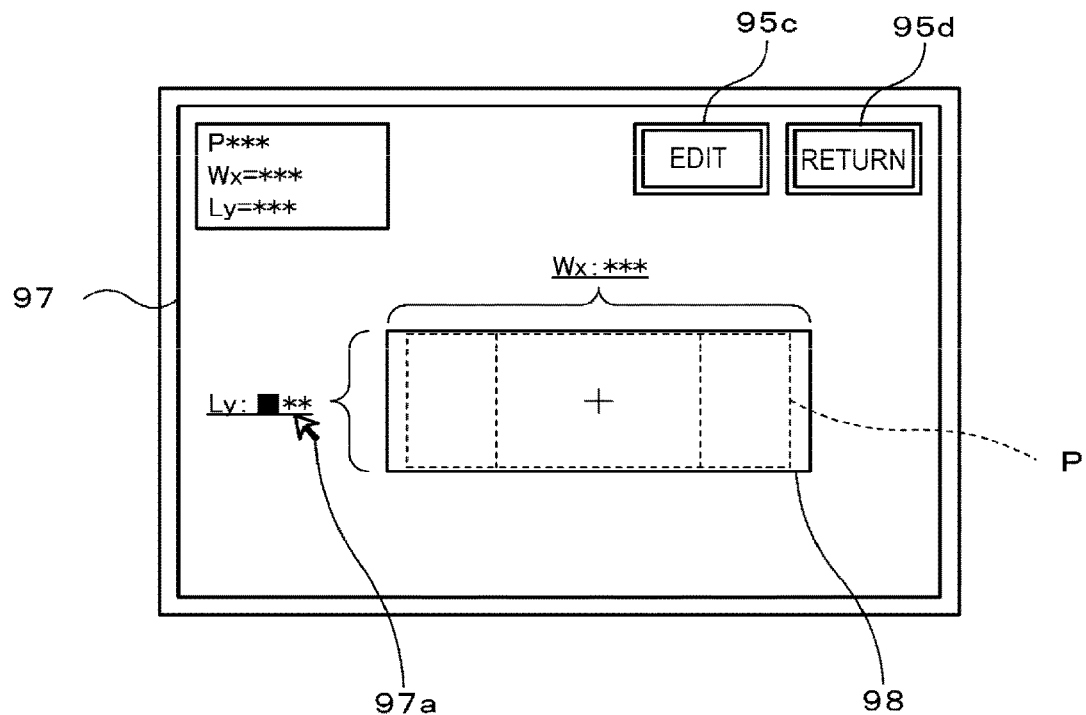
FIG. 9 is an explanatory view illustrating an example of edit screen 97 including shape data image 98 of component P.

FIG. 9 is an explanatory view illustrating an example of edit screen 97 including shape data image 98 of component P. In edit screen 97, shape data image 98 indicating the outer shape of component P is displayed in a transparent manner by solid lines, and an enlarged image of component P is displayed so as to align the center with shape data image 98 to be overlapped. The enlarged image of component P is the same image as enlarged image 94 except that the inclination is corrected. Width Wx in the X-direction and length Ly in the Y-direction are displayed in shape data image 98 so as to be editable. The operator can select either width Wx or length Ly with cursor 97a, and input (correct) a numerical value by an operation input of input device 87. In S230, CPU 82 accepts the correction by changing the shape (size) of shape data image 98 in accordance with the numerical value inputted by the operator. In addition, on edit screen 97, the component type and numerical values of width Wx and length Ly before the edit is started, confirmation button image 95c, and return button image 95d are displayed. Confirmation button image 95c is a button image for starting a confirmation test of the shape data and return button image 95d is a button image for returning from edit screen 97 to confirmation screen 91. These can be selected by operating cursor 97a.

In addition, CPU 82 waits for confirmation button image 95c to be operated (S235) or return button image 95d to be operated (S240). When return button image 95d is operated, CPU 82 returns to S210 without reflecting the correction and returns the display from edit screen 97 to confirmation screen 91 including enlarged image 94. On the other hand, when confirmation button image 95c is operated, CPU 82 executes a confirmation test for confirming the outer shape of component P in the image using the edited shape data in which the numerical values of width Wx, length Ly, and the like are corrected (S245). Here, for example, in a case in which an image processing error with a dimensional defect of component P frequently occurs in the shape data before edit due to an influence of a manufacturing error of component P, an imaging state in part camera 28, or the like, the operator corrects the shape data in accordance with an actual size of component P in the image. In S245, CPU 82 applies the corrected shape data to another component P having the same shape data, such as the same component type, to perform a confirmation test as to whether the dimension is defective, and displays the confirmation result on the screen. CPU 82 determines whether the operator approves the confirmation result (S250) and if the operator does not approve the result, the processing returns to S225 to display the edit screen. On the other hand, when the operator approves the result, CPU 82 stores the shape data after the edit (S255), reflects the edit content, and terminates the confirmation display processing. CPU 82 permits mounting device 20 to restart production when the processing is terminated by reflecting the edit content in a case in which mounting device 20 stops the production due to the occurrence of the image processing error.

Figure 10:
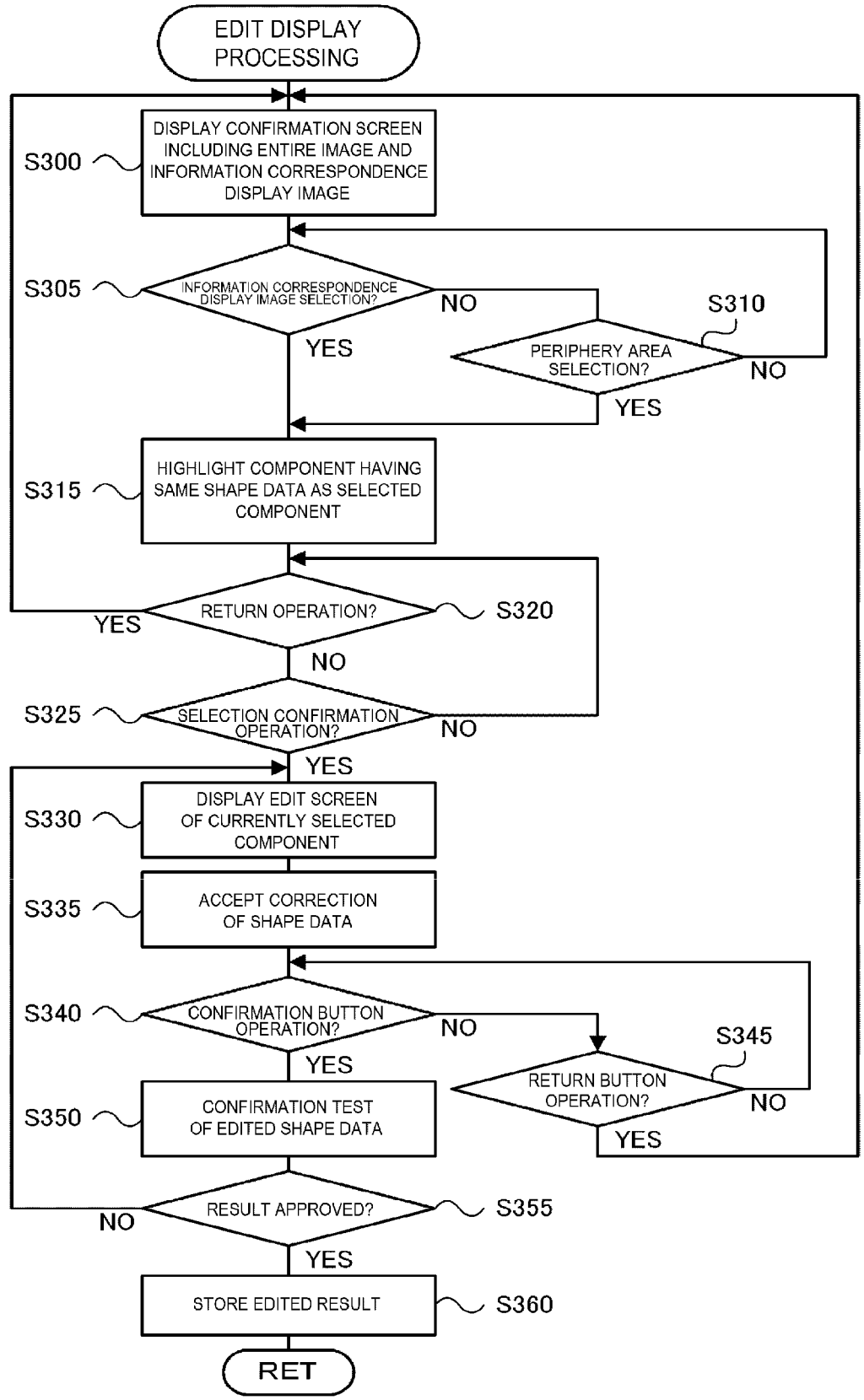
FIG. 10 is a flowchart illustrating an example of edit display processing.

Next, the edit display processing will be described. FIG. 10 is a flowchart illustrating an example of the edit display processing. In the edit display processing, first, CPU 82 displays, on display 90, confirmation screen 91B including entire image 92 of component P and information correspondence display image 99 in which relevant information 86 is displayed in association with the periphery of each component P (S300).

Figure 11:
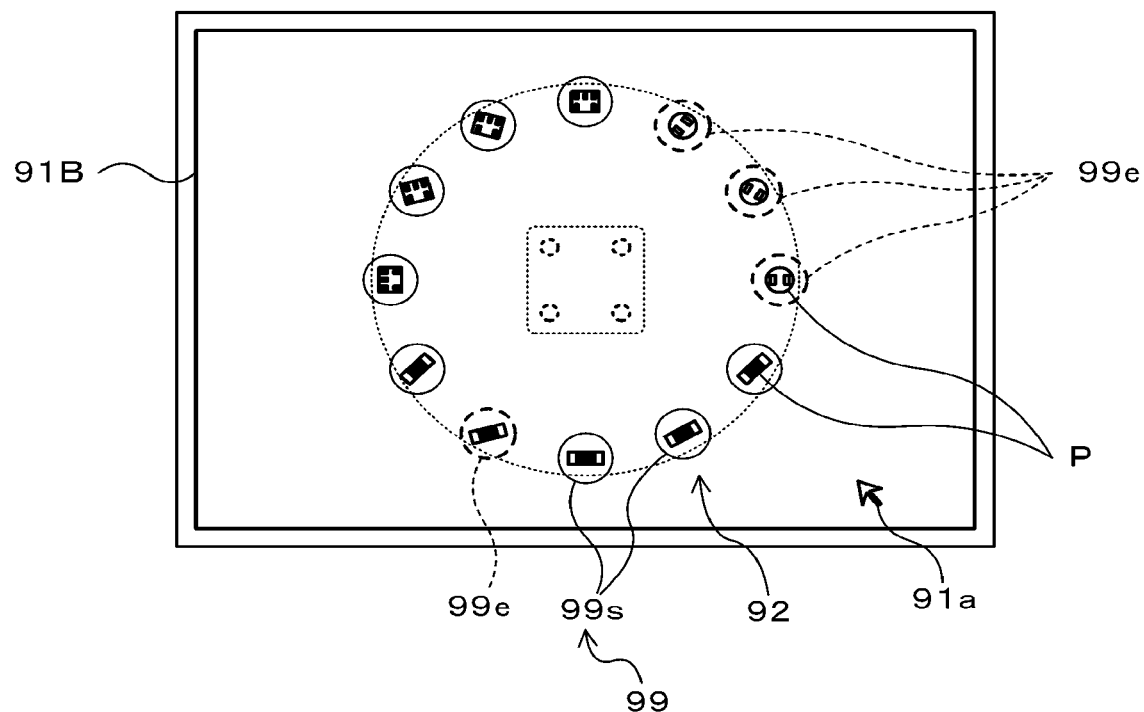
FIG. 11 is an explanatory view illustrating an example of confirmation screen 91B including entire image 92 of component P and information correspondence display image 99.

FIG. 11 is an explanatory view illustrating an example of confirmation screen 91B including entire image 92 of component P and information correspondence display image 99. As illustrated in the drawing, information correspondence display image 99 associated with the periphery of each component P is displayed on confirmation screen 91B in same entire image 92 as the image (refer to FIG. 3) captured by part camera 28. Information correspondence display image 99 is an image in a circular shape surrounding component P, in which information correspondence display images 99s in a normal mode indicating that an error has not occurred are displayed by solid lines, and information correspondence display images 99e in an error mode indicating that an error has occurred are displayed by dotted lines. That is, information correspondence display image 99 displays the presence or absence of the error of corresponding component P by a difference in line type, but may be displayed by a difference in color, a difference in line thickness, a difference in shape, or the like. In addition, cursor 91a that can be selected and inputted by input device 87 is displayed on confirmation screen 91B, so that information correspondence display image 99 can be selected.

Figure 12:
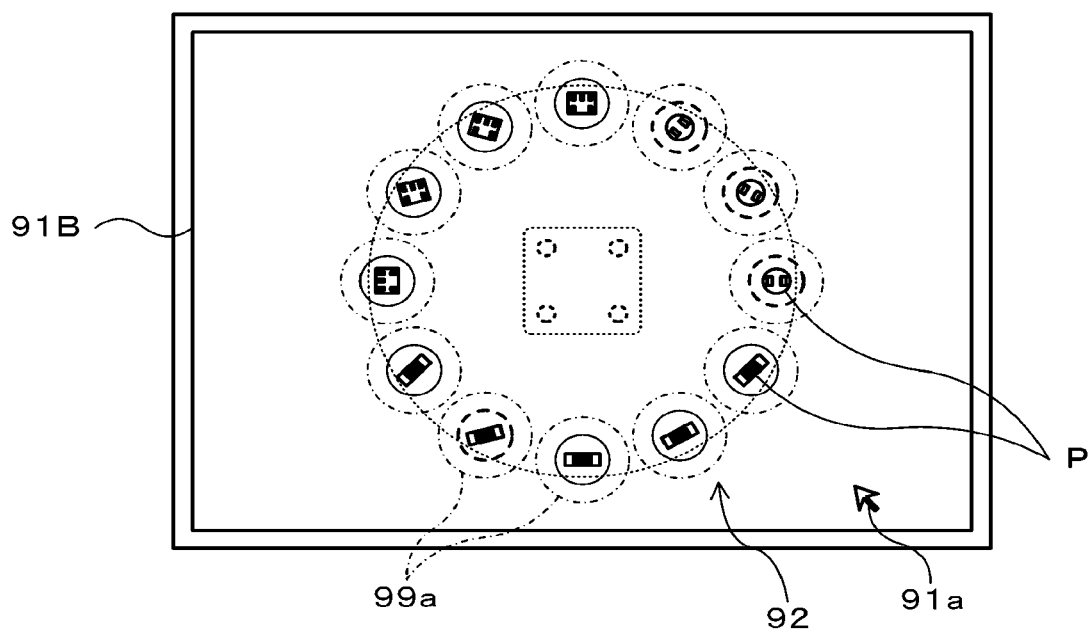
FIG. 12 is an explanatory view illustrating selectable area 99a in a periphery of information correspondence display image 99.

In confirmation screen 91B, an area in the periphery of information correspondence display image 99 can also be selected by cursor 91a. FIG. 12 is an explanatory view illustrating selectable area 99a in the periphery of information correspondence display image 99. As illustrated in the drawing, selectable area 99a is a circular area that is once larger information correspondence display image 99 and is set in association with each information correspondence display image 99. Although selectable area 99a is illustrated by one-dot chain lines in FIG. 12, selectable area 99a is not actually displayed on the screen. When cursor 91a is moved into any of the selectable areas 99a by the operation of the operator, information correspondence display image 99 corresponding to selectable area 99a can be selected even outside the area of information correspondence display image 99. Selectable area 99a may be sized from the center position of each suction nozzle 34 and the size of component P so as not to overlap with each other, or may be sized from an interval between adjacent suction nozzles 34.

Figure 13:
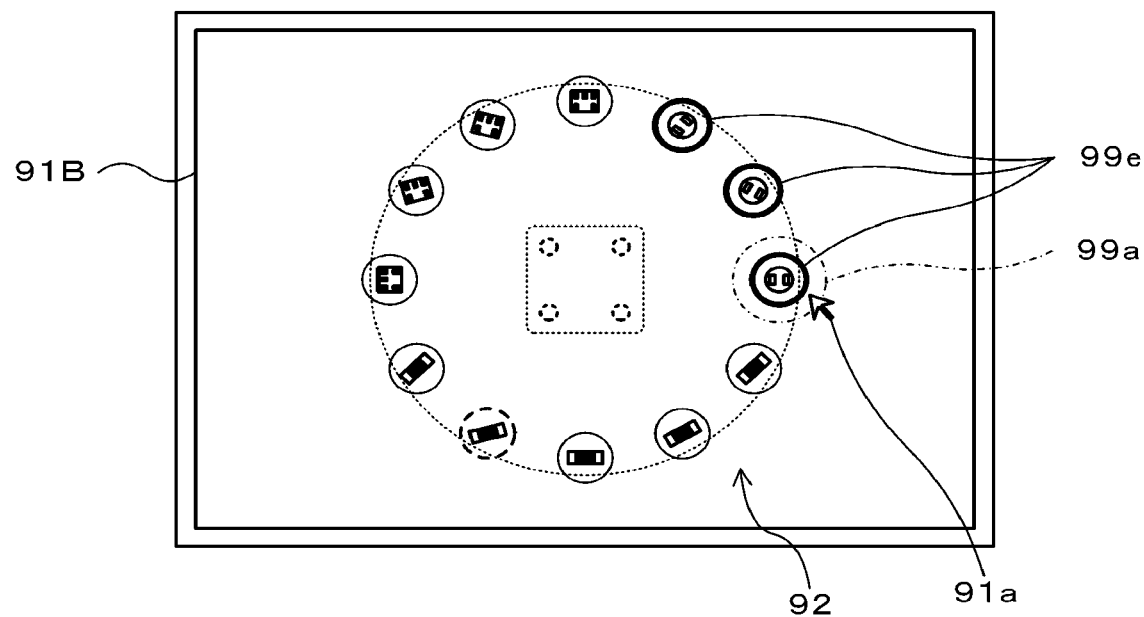
FIG. 13 is an explanatory view illustrating a state in which information correspondence display image 99 is highlighted.

When displaying confirmation screen 91B, CPU 82 waits for the relevant information to be selected by whether any of information correspondence display images 99 is selected (S305), whether selectable area 99a in the periphery of information correspondence display image 99 is selected (S310). When the relevant information is selected by selecting any one of information correspondence display images 99 or selectable area 99a in the periphery thereof, CPU 82 highlights component P for which the relevant information is selected and component P of which the shape data is the same (S315). FIG. 13 is an explanatory view illustrating a state in which information correspondence display image 99 is highlighted. FIG. 13 illustrates a case in which, since cursor 91a has moved into selectable area 99a at the three o'clock position in the drawing, the relevant information of information correspondence display image 99 surrounded by selectable area 99a is selected. In this case, information correspondence display image 99 corresponding to component P having the same shape data, here, three information correspondence display images 99 including information correspondence display images 99 at positions at the one o'clock and the two o'clock in the drawing are highlighted by thick lines. Components P having different shape data are not highlighted and remain in the original display. As described above, in S315, CPU 82 highlights information correspondence display image 99. Therefore, when selecting one component P and editing the shape data, the operator can easily grasp which other component P the edited result is reflected in and which component P is commonly subjected to the confirmation test.

When the highlighting is performed in this manner, CPU 82 waits for a return operation to be performed (S320) or a selection confirmation operation to be performed by an operation input of input device 87 (S325). The return operation is, for example, an operation of moving cursor 91a to the outside of selectable area 99a. The selection confirmation operation is, for example, a predetermined operation of input device 87 such as clicking the mouse. When the return operation is performed, CPU 82 returns the processing to S300. On the other hand, when the selection confirmation operation is performed, CPU 82 displays edit screen 97 for editing the shape data of currently selected component P on display 90 (S330), and accepts the correction of the shape data by the operator (S335). Since the method of correcting the content and the shape data of edit screen 97 is the same as that in S225 and S230 of the confirmation display processing, descriptions thereof will be omitted. Next, as in S235 to S250 of the confirmation display processing, CPU 82 waits for confirmation button image 95c to be operated (S340) or return button image 95d to be operated (S345), and when return button image 95d is operated, the processing returns to S300 to return the display to confirmation screen 91B. On the other hand, when confirmation button image 95c is operated, CPU 82 executes a confirmation test with the shape data after the edit (S350) and determines whether the operator approved the result of the confirmation test (S355). If the operator does not approve the result, CPU 82 returns to S330 to display the edit screen and if the operator approves the result, CPU 82 stores the shape data after the edit (S360), reflects the edited content, and terminates the confirmation display processing.

Here, correspondence relationships between constituent elements of the present embodiment and constituent elements of the present disclosure will be clarified. Management device 80 of the present embodiment corresponds to the image display device of the present disclosure, display 90 corresponds to the display screen, and CPU 82 of control device 81 corresponds to the display control section. In addition, management device 80 including CPU 82 and display 90 for performing the confirmation display processing in S130 of the image display relevant processing routine corresponds to the first image display device, and management device 80 including CPU 82 and display 90 for performing the edit display processing in S140 of the image display relevant processing routine corresponds to the second image display device. In the present embodiment, an example of the image display method of the present disclosure is also described by explaining the operation of management device 80.

Management device 80 described above displays, on display 90, confirmation screen 91 including entire image 92 captured by part camera 28 and information list display image 93 in which the relevant information of component P is listed. Since management device 80 displays enlarged image 94 of one component P corresponding to the relevant information selected by the operator, the operator can easily select component P to be enlarged without making a selection error of component P, and can appropriately perform the confirmation operation of component P using the enlarged image.

In addition, since management device 80 displays edit button image 95a together with enlarged image 94, and displays edit screen 97 when edit button image 95a is operated, it is possible to prevent the selection error of component P of the edit target. In addition, since the relevant information is listed in information list display image 93 in the order corresponding to the display positions of multiple components P in entire image 92, the relevant information can be selected more easily.

In addition, management device 80 displays, on display 90, confirmation screen 91B including entire image 92 and information correspondence display image 99 in which the relevant information is associated with the periphery of each component P. Since management device 80 displays edit screen 97 of component P corresponding to information correspondence display image 99 selected by the operator, the operator can easily select component P to be edited without making a selection error of component P, so that the edit operation can be promptly started. Therefore, it is possible to prevent the operator from editing the shape data of wrong component P.

In addition, since management device 80 highlights information correspondence display image 99 of component P of which the shape data is the same as component P corresponding to selected information correspondence display image 99, the operator can easily grasp which other component P after edit of the shape data is reflected in. In addition, since the periphery of information correspondence display image 99 is set as selectable area 99a, it is possible to make it easier for the operator to select the relevant information corresponding to desired component P.

In information list display image 93 and information correspondence display image 99, since the error information indicating the presence or absence of an error in component P is displayed in association with each other, the operator can easily grasp and select component P in which the error has occurred.

Needless to say, the present disclosure is not limited in any way to the embodiments that have been described heretofore and can be implemented in various aspects as long as it belongs to the technical scope of the present disclosure.

For example, in the above embodiments, although confirmation screen 91 is displayed in the confirmation display processing in S130, the configuration is not limited to this and confirmation screen 91B may be displayed. In addition, although confirmation screen 91B is displayed in the edit display processing of S140, the configuration is not limited to this and confirmation screen 91 may be displayed.

In the above embodiments, information list display image 93 of confirmation screen 91 includes the nozzle number, the component type, and the error code, but the configuration is not limited to this and may include only the nozzle number and the error code, or may include other information such as the serial number (identification information) and the disposition position of component P, and information relating to the image processing result in information list display image 93. In information list display image 93, the relevant information is listed in the order corresponding to the display position of component P, but the configuration is not limited to this and may be listed in the order not corresponding to the display position of component P.

In the above embodiments, the circular image is exemplified as information correspondence display image 99, but the configuration is not limited to this and an image indicating error information may be displayed such as displaying a character or a symbol indicating an error in the periphery of error component P. In addition, although selectable area 99a is provided in the periphery of information correspondence display image 99, the configuration is not limited to this and selectable area 99a may not be provided.

In the above embodiments, when any of information correspondence display images 99 is selected on confirmation screen 91B, information correspondence display image 99 corresponding to component P having the same shape data is highlighted by thick lines but the configuration is not limited to this, and may be highlighted in another display mode such as blinking or changing colors. In addition, the display is not limited to the highlight and the highlight may not be performed.

In the above embodiments, enlarged image 94 of component P and edit button image 95a are displayed, and edit screen 97 is displayed by operating edit button image 95a; however, the configuration is not limited to this. For example, edit screen 97 may be displayed by a predetermined operation of input device 87 such as a clicking operation of the mouse button without displaying edit button image 95a. Alternatively, instead of shifting from enlarged image 94 of component P to edit screen 97, only the confirmation using enlarged image 94 of component P may be performed on confirmation screen 91, so that S220 to S255 of the confirmation display processing may be omitted.

In the above embodiments, both the enlarged display of component P and the edit of the shape data of component P are executed but the configuration is not limited to this, and any one of them may be executed. For example, in a case in which only the enlarged display of component P is executed, S140 of the image display relevant processing routine may be omitted and S220 to S255 of the confirmation display processing may be omitted. In addition, in a case in which only edit of the shape data of component P is executed, S130 of the image display relevant processing routine may be omitted.

In the above embodiments, confirmation screens 91 and 91B, and edit screen 97 being displayed on display 90 of management device 80 are exemplified, but the configuration is not limited to this and they may be displayed on display screen 37 of operation panel 36 of mounting device 20 or the operation panel of the inspection device.

Here, the image display device according to the present disclosure may be configured as follows. In a first image display device of the present disclosure, the display control section may operably display a predetermined edit button image together with the enlarged image of the one component, and may display an edit screen capable of editing shape data relating to the shape of the one component when the edit button image is operated by the operator. Accordingly, since the edit operation of the component of the edit target can be started as it is after the component is confirmed by the enlarged image, it is possible to prevent the selection error of the component of the edit target.

A second image display device of the present disclosure is an image display device configured to display, on a display screen, a predetermined image captured in a state in which multiple components to be mounted on a board are held by a mounting head, the device including a display control section configured to selectably display, on the display screen, relevant information relating to the multiple components in association with each component, together with the predetermined image, and when a predetermined operation involving selection of any of the relevant information is performed by an operator, display an edit screen capable of editing shape data relating to a shape of one component corresponding to the selected relevant information of the predetermined image being displayed.

The second image display device according to the present disclosure selectably displays relevant information relating to multiple components in association with each component, together with a predetermined image captured in a state in which multiple components to be mounted on a board are held by a mounting head. When a predetermined operation involving the selection of any of the relevant information is performed by the operator, an edit screen, which is capable of editing shape data relating to a shape of one component corresponding to the selected relevant information of the predetermined image being displayed, is displayed. As a result, the operator can cause the edit screen of a desired component to be displayed by performing a predetermined operation involving the selection of the relevant information from the multiple components in the predetermined image while paying attention to the relevant information. Therefore, it is possible to appropriately perform the edit operation of the shape data of the component without making a selection error of the component of the edit target.

In the second image display device of the present disclosure, the display control section may highlight the relevant information of a component having the same shape data as that of one component corresponding to the relevant information selected by the operator in the predetermined image so as to be distinguished from the relevant information of a component having different shape data from that of the one component. As a result, when the relevant information is selected to edit the shape data of the component, the operator can easily grasp which other component the edited shape data is reflected in.

In the first or second image display device of the present disclosure, the image may be used for predetermined image processing performed on the multiple components, and the relevant information may include error information indicating that an error has occurred in the image processing. As a result, the operator can easily grasp the component in which the error has occurred from the relevant information and can appropriately select the component. Therefore, it is possible to promptly confirm the failure of the component from the enlarged image of the component in which the error has occurred, or to promptly edit the shape data of the component in which the error has occurred.

In the first or second image display device according to the present disclosure, the display control section may selectably list the relevant information in the order corresponding to the display positions of the multiple components in the predetermined image. As a result, the correspondence between the display position of the component in the predetermined image and the associated display for each component can be made easy to understand by the operator, so that the operator can more easily select the relevant information corresponding to the desired component.

In the first or second image display device of the present disclosure, the display control section may selectably display the relevant information at positions corresponding to display positions of the multiple components in the predetermined image, and may make a predetermined area of the periphery of the relevant information a selectable area of the relevant information. According to such a configuration, when selecting the relevant information, since a predetermined area of the periphery thereof may be selected, it is possible to make it easier for the operator to select the relevant information corresponding to the desired component.

A first image display method of the present disclosure is an image display method for displaying, on a display screen, a predetermined image captured in a state in which multiple components to be mounted on a board are held by a mounting head, the method including: (a) a step of selectably displaying, on the display screen, relevant information relating to the multiple components in association with each component, together with the predetermined image; and (b)

a step of, when a predetermined operation involving selection of any of the relevant information is performed by an operator, displaying an enlarged image of one component corresponding to the selected relevant information of the predetermined image being displayed.

In the first image display method of the present disclosure, similarly to the first image display device described above, it is possible to easily perform the component confirmation operation using the enlarged image without making a selection error of the component to be enlarged. In the first image display method, various modes of the first image display device may be employed, or a step for realizing each function of the first image display device may be added.

A second image display method of the present disclosure is an image display method for displaying, on a display screen, a predetermined image captured in a state in which multiple components to be mounted on a board are held by a mounting head, the method including: (a) a step of selectably displaying, on the display screen, relevant information relating to the multiple components in association with each component, together with the predetermined image; and (b) a step of, when a predetermined operation involving selection of any of the relevant information is performed by an operator, displaying an edit screen capable of editing shape data relating to a shape of one component corresponding to the selected relevant information of the predetermined image being displayed.

In the second image display method of the present disclosure, similarly to the second image display device described above, it is possible to appropriately perform the edit operation of the shape data of the component without making a selection error of the component of the edit target. In the second image display method, various modes of the second image display device may be employed, or a step for realizing each function of the second image display device may be added.

INDUSTRIAL APPLICABILITY

The present disclosure can be used in, for example, a technical field in which multiple components held by a mounting head are mounted on a board.

REFERENCE SIGNS LIST

10 component mounting system, 12 LAN, 20 mounting device, 21 mounting control unit, 22 CPU, 23 ROM, 24 RAM, 25 HDD, 27 supply unit, 28 part camera, 28*a* lighting section, 28*b* camera main body, 29 input and output interface, 30 board processing unit, 32 mounting processing unit, 33 mounting head, 34 suction nozzle, 35 moving mechanism, 36 operation panel, 37 display screen, 38 operation button, 40 inspection device, 80 management device, 81 control device, 82 CPU, 83 ROM, 84 RAM, 85 HDD, 86 relevant information, 87 input device, 89 input and output interface, 90 display, 91, 91B confirmation screen, 91*a*, 97*a* cursor, 92 entire image, 93 information list display image, 94 enlarged image, 95*a* edit button image, 95*b*, 95*d* return button image, 95*c* confirmation button image, 97 edit screen, 98 shape data image, 99, 99*e*, 99*s* information correspondence display image, 99*a* selectable area, P component

The invention claimed is:
1. An image display device, comprising:
circuitry configured to:

display, on a display screen, a predetermined image of a mounting head captured in a state in which multiple components to be mounted on a board are held by the mounting head;
selectably display, on the display screen, information relating to the multiple components in association with each of the multiple components, together with the predetermined image, such that for each one of the multiple components, a corresponding information relating to the one component is displayed together with the predetermined image of the mounting head; and
when a predetermined operation involving selection of any of the information relating to the multiple components is performed by an operator, display an enlarged image of the one component corresponding to the selected information related to the one component.

2. The image display device according to claim 1, wherein the circuitry is configured to
operably display a predetermined edit button image together with the enlarged image of the one component, and
display an edit screen capable of editing shape data relating to a shape of the one component when the edit button image is operated by the operator.

3. An image display device, comprising:
circuitry configured to:
display, on a display screen, a predetermined image of a mounting head captured in a state in which multiple components to be mounted on a board are held by the mounting head;
selectably display, on the display screen, information relating to the multiple components in association with each of the multiple components, together with the predetermined image, such that for each one of the multiple components, a corresponding information relating to the one component is displayed together with the predetermined image of the mounting head; and
when a predetermined operation involving selection of any of the relevant information relating to the multiple components is performed by an operator, display an edit screen capable of editing shape data relating to a shape of the one component corresponding to the selected information related to the one component.

4. The image display device according to claim 3, wherein the circuitry is configured to highlight the information of another component of the multiple components having the same shape data as that of the one component corresponding to the selected information so as to be distinguished from the information of another component of the multiple components having different shape data from that of the one component corresponding to the selected information.

5. The image display device according to claim 1, wherein the predetermined image is used for predetermined image processing performed on the multiple components, and the information includes error information indicating that an error has occurred in the image processing.

6. The image display device according to claim 1, wherein the circuitry is configured to selectably list the information relating to the multiple components in an order corresponding to display positions of the multiple components in the predetermined image.

7. The image display device according to claim 1, wherein the circuitry is configured to:

selectably display the information relating to the multiple components at positions corresponding to display positions of the multiple components in the predetermined image, and make a predetermined area of a periphery of each of the information relating to the multiple components a selectable area of the corresponding information.

8. An image display method, comprising:

displaying, on a display screen, a predetermined image of a mounting head captured in a state in which multiple components to be mounted on a board are held by the mounting head;

selectably displaying, on the display screen, information relating to the multiple components in association with each of the multiple components, together with the predetermined image, such that for each one of the multiple components, a corresponding information relating to the one component is displayed together with the predetermined image of the mounting head; and when a predetermined operation involving selection of any of the information relating to the multiple components is performed by an operator, displaying an enlarged image of the one component corresponding to the selected information related to the one component.

9. An image display method, comprising:

displaying, on a display screen, a predetermined image of a mounting head captured in a state in which multiple components to be mounted on a board are held by the mounting head;

selectably displaying, on the display screen, information relating to the multiple components in association with each of the multiple components, together with the predetermined image, such that for each one of the multiple components, a corresponding information relating to the one component is displayed together with the predetermined image of the mounting head; and when a predetermined operation involving selection of any of the information relating to the multiple components is performed by an operator, displaying an edit screen capable of editing shape data relating to a shape of the one component corresponding to the selected information related to the one component.

10. The image display device according to claim 1, wherein the information relating to the multiple components includes at least one of a nozzle number of a suction nozzle which holds a respective component, a component type of the respective component, and a disposition of the respective component, and the information relating to the multiple components is displayed, together with the predetermined image, such that for each one of the multiple components, at least one of the nozzle number of the suction nozzle which holds the one component, the component type of the one component, and the disposition of the one component is displayed together with the predetermined image of the mounting head.

11. The image display device according to claim 1, wherein the information relating to the multiple components includes at least two of a nozzle number of a suction nozzle which holds a respective component, a component type of the respective component, and a disposition of the respective component, and the information relating to the multiple components is displayed, together with the predetermined image, such that for each one of the multiple components, at least two of the nozzle number of the suction nozzle which holds the one component, the component type of the one component, and the disposition of the one component are displayed together with the predetermined image of the mounting head.

12. The image display device according to claim 1, wherein the information relating to the multiple components includes a nozzle number of a suction nozzle which holds a respective component, a component type of the respective component, and a disposition of the respective component, and the information relating to the multiple components is displayed, together with the predetermined image, such that for each one of the multiple components, the nozzle number of the suction nozzle which holds the one component, the component type of the one component, and the disposition of the one component are displayed together with the predetermined image of the mounting head.

13. The image display device according to claim 3, wherein the predetermined image is used for predetermined image processing performed on the multiple components, and the information includes error information indicating that an error has occurred in the image processing.

14. The image display device according to claim 3, wherein the circuitry is configured to selectably list the information relating to the multiple components in an order corresponding to display positions of the multiple components in the predetermined image.

15. The image display device according to claim 3, wherein the circuitry is configured to:

selectably display the information relating to the multiple components at positions corresponding to display positions of the multiple components in the predetermined image, and make a predetermined area of a periphery of each of the information relating to the multiple components a selectable area of the corresponding information.

16. The image display device according to claim 3, wherein the information relating to the multiple components includes at least one of a nozzle number of a suction nozzle which holds a respective component, a component type of the respective component, and a disposition of the respective component, and the information relating to the multiple components is displayed, together with the predetermined image, such that for each one of the multiple components, at least one of the nozzle number of the suction nozzle which holds the one component, the component type of the one component, and the disposition of the one component is displayed together with the predetermined image of the mounting head.

17. The image display device according to claim 3, wherein the information relating to the multiple components includes at least two of a nozzle number of a suction nozzle which holds a respective component, a component type of the respective component, and a disposition of the respective component, and the information relating to the multiple components is displayed, together with the predetermined image, such that for each one of the multiple components, at least two of the nozzle number of the suction nozzle which holds the one component, the component type of the one component, and the disposition of the one component are displayed together with the predetermined image of the mounting head.

18. The image display device according to claim 3, wherein the information relating to the multiple components includes a nozzle number of a suction nozzle which holds a respective component, a component type of the respective component, and a disposition of the respective component, and the information relating to the multiple components is displayed, together with the predetermined image, such that for each one of the multiple components, the nozzle number of the suction nozzle which holds the one component, the component type of the one component, and the disposition of the one component are displayed together with the predetermined image of the mounting head.

\* \* \* \* \*